(12) United States Patent
Bohannon et al.

(10) Patent No.: US 9,541,588 B2
(45) Date of Patent: Jan. 10, 2017

(54) CURRENT-MODE COARSE-BASELINE-CORRECTION

(71) Applicant: Synaptics Incorporated, San Jose, CA (US)

(72) Inventors: Eric Scott Bohannon, Henrietta, NY (US); Marshall J Bell, Jr., Dripping Springs, TX (US); Kirk Hargreaves, Mountain View, CA (US); Murat Ozbas, Rochester, NY (US); Jeffrey A. Small, Rochester, NY (US)

(73) Assignee: SYNAPTICS INCORPORATED, San Jose, CA (US)

( * ) Notice: Subject to any disclaimer, the term of this patent is extended or adjusted under 35 U.S.C. 154(b) by 491 days.

(21) Appl. No.: 14/067,863

(22) Filed: Oct. 30, 2013

(65) Prior Publication Data
US 2015/0115977 A1    Apr. 30, 2015

(51) Int. Cl.
*G01R 27/26*    (2006.01)
*G01R 35/00*    (2006.01)
*G06F 3/044*    (2006.01)

(52) U.S. Cl.
CPC ......... *G01R 27/2605* (2013.01); *G01R 35/005* (2013.01); *G06F 3/044* (2013.01)

(58) Field of Classification Search
CPC .............. G06F 3/44; G06F 3/45; G06F 3/412; G06F 3/418; G01R 27/2605; G01R 35/05; H04L 25/278
See application file for complete search history.

(56) References Cited

U.S. PATENT DOCUMENTS

| | | | |
|---|---|---|---|
| 5,936,537 A | * | 8/1999 | Burns ................... G01R 21/01 324/627 |
| 6,590,799 B1 | | 7/2003 | Rickes et al. |
| 6,714,469 B2 | | 3/2004 | Rickes et al. |

(Continued)

FOREIGN PATENT DOCUMENTS

| WO | WO-2010111668 A1 | 9/2010 |
|---|---|---|
| WO | WO-2012143752 A2 | 10/2012 |

OTHER PUBLICATIONS

Robinson, John, New CCII Current Convyor, maxim integrated, Mar. 27, 2008, <http://www.maximintegrated.com/app-notes/index.mvp/id/4198>.

(Continued)

*Primary Examiner* — Minh N Tang
(74) *Attorney, Agent, or Firm* — Patterson + Sheridan, LLP

(57) ABSTRACT

The embodiments herein are generally directed to using a current-mode CBC circuit to maintain a voltage bias setting at a receiver when performing capacitive sensing. To do so, the CBC circuit may compensate for the change in voltage at a receiver by providing a current at the input of the receiver. Instead of using a passive CBC capacitor for each receiver, the input device may use a single CBC capacitor and a plurality of current mirrors to source and sink the current required to correct the input voltage at a plurality of receivers. As a result, the current-mode CBC circuit includes only one passive capacitor (or bank of capacitors) and a plurality of current mirrors which may provide space and cost benefits relative to a CBC circuit that uses a passive capacitor (or bank of capacitors) for each receiver channel.

21 Claims, 6 Drawing Sheets

(56) References Cited

U.S. PATENT DOCUMENTS

| | | |
|---|---|---|
| 8,928,359 B2 | 1/2015 | Bell et al. |
| 2005/0212614 A1 | 9/2005 | Peluso |
| 2010/0289779 A1 | 11/2010 | Routley et al. |
| 2010/0327882 A1* | 12/2010 | Shahparnia .............. G01D 3/08 324/659 |
| 2011/0096587 A1 | 4/2011 | Kim et al. |
| 2011/0210939 A1 | 9/2011 | Reynolds et al. |
| 2012/0043977 A1 | 2/2012 | Kremin et al. |
| 2012/0049868 A1 | 3/2012 | Maharyta |
| 2012/0280744 A1 | 11/2012 | Hsieh |
| 2012/0286800 A1 | 11/2012 | Maharyta et al. |
| 2013/0063395 A1 | 3/2013 | Byun et al. |

OTHER PUBLICATIONS

Written Opinion of the International Searching Authority, PCT/US2014/058004 dated Jan. 21, 2015, consists of 13 pages.

Notification Concerning Transmittal of International Preliminary Report on Patentability, PCT/US2014/058004 dated May 12, 2016, consists of 10 pages.

\* cited by examiner

CURRENT-MODE COARSE-BASELINE-CORRECTION

BACKGROUND OF THE INVENTION

Field of the Invention

Embodiments of the present invention generally relate to performing coarse-baseline-correction, and more specifically, to performing a current-mode coarse-baseline correction using programmable current mirrors.

Description of the Related Art

Input devices including proximity sensor devices (also commonly called touchpads or touch sensor devices) are widely used in a variety of electronic systems. A proximity sensor device typically includes a sensing region, often demarked by a surface, in which the proximity sensor device determines the presence, location and/or motion of one or more input objects. Proximity sensor devices may be used to provide interfaces for the electronic system. For example, proximity sensor devices are often used as input devices for larger computing systems (such as opaque touchpads integrated in, or peripheral to, notebook or desktop computers). Proximity sensor devices are also often used in smaller computing systems (such as touch screens integrated in cellular phones).

SUMMARY OF THE INVENTION

One embodiment described herein is a system comprising a sensor comprising a transmitter electrode and a receiver electrode and a coarse baseline correction (CBC) circuit. The CBC circuit includes a capacitor coupled to the transmitter electrode and a current mirror where an input of the current mirror is electrically coupled to the capacitor and an output of the current mirror is coupled to the receiver electrode.

Another embodiment described herein is a processing system. The processing system includes a transmitter circuit configured to drive a modulated signal on a transmitter electrode, a receiver circuit configured to receive a resulting signal from a receiver electrode based on the modulated signal and a coarse baseline correction (CBC) circuit. The CBC circuit includes a capacitor coupled to an output of the transmitter circuit and a current mirror where an input of the current mirror is electrically coupled to the capacitor and an output of the current mirror is coupled to an input of the receiver circuit.

Another embodiment described herein is a coarse baseline correction (CBC) circuit that includes a resistance element, a capacitor coupled to the resistance element, and a plurality of current mirrors. Each input of the plurality of current mirrors are electrically coupled to the capacitor and each output of the plurality of current mirrors are coupled to an input of respective receiver circuits. Moreover, the plurality of current mirrors generates respective currents that compensate for a change of charge at the input of the respective receiver circuits.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

Figure 1:
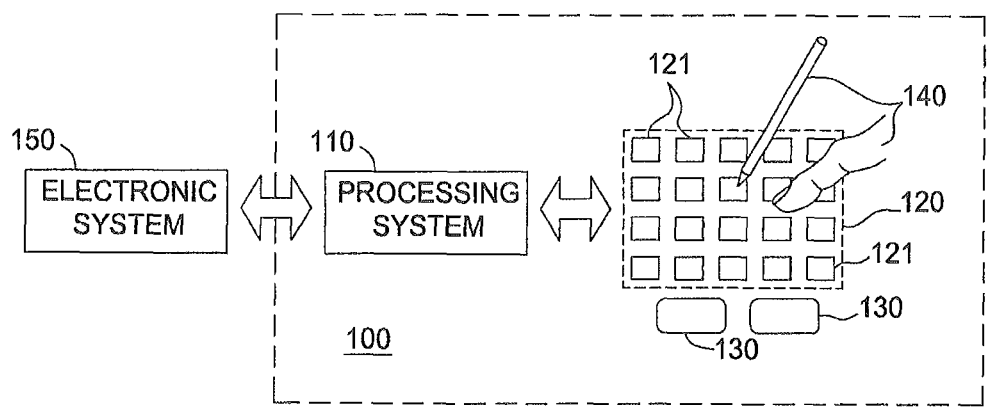
FIG. 1 is a schematic block diagram of an exemplary input device, according to an embodiment described herein.

To facilitate understanding, identical reference numerals have been used, where possible, to designate identical elements that are common to the figures. It is contemplated that elements disclosed in one embodiment may be beneficially utilized on other embodiments without specific recitation. The drawings referred to here should not be understood as being drawn to scale unless specifically noted. Also, the drawings are often simplified and details or components omitted for clarity of presentation and explanation. The drawings and discussion serve to explain principles discussed below, where like designations denote like elements.

DETAILED DESCRIPTION

The following detailed description is merely exemplary in nature and is not intended to limit the invention or the application and uses of the invention. Furthermore, there is no intention to be bound by any expressed or implied theory presented in the preceding technical field, background, brief summary or the following detailed description.

Various embodiments of the present technology provide input devices and methods for improving usability. Specifically, the embodiments are generally directed to using a current-mode coarse-baseline-correction (CBC) circuit to maintain a voltage bias setting at a receiver when performing capacitive sensing. For example, a transmitter may drive a transmitter signal used for capacitive sensing onto a transmitter electrode in an input device. Because of capacitive coupling, the transmitter signal may generate a resulting signal on a receiver electrode. The voltage variation in the resulting signal may change the voltage bias at the input of a receiver. If an interfering signal adds additional voltage (i.e., noise) onto the receiver electrode, the voltage may exceed the rail voltages of the receiver, and thus, any change in voltage caused by an input object (e.g., a touch event) may be missed by the receiver. For example, the voltage at a receiver may be biased at VDD/2, but the transmitter signal may drive this voltage between VDD/4 and 3*VDD/4. An interfering signal may then cause the voltage at the receivers input to swing all the way to VDD and exceed the dynamic range of the receiver. In such a case, the change in voltage at the receiver based on a input object (e.g., a human finger) capacitively coupling to the transmitter or receiver electrodes may not be measured or detected by the receiver since the voltage may continue to hit the rail voltage—i.e., VDD.

Instead, the input device may include a CBC circuit that maintains (or corrects) the voltage at the input of the receiver. To do so, the CBC circuit may compensate for the change in voltage at the receiver resulting from driving the transmitter signal on the transmitter electrode. In one embodiment, the CBC circuit may source and/or sink current at the input of the receiver in order to maintain the receiver voltage at its predetermined bias point—e.g., VDD/2—even as the transmitter signal is driven onto the transmitter electrode. In this manner, the receiver has more headroom to prevent an interfering signal from maxing out the voltage of the receiver. Stated differently, even if an interfering signal changes the voltage on the receiver electrode, the additional headroom provided by using the CBC circuit may prevent the receiver input voltage from reaching the rails. Thus, any changes in voltage resulting from the input object interacting with the input device may still be detected by the receiver.

In one embodiment, the CBC circuit may include passive circuit components (e.g., a CBC capacitor) in order to correct the receiver voltage. As dimensions of the integrated circuit or circuits that include the transmitter, receiver, and CBC circuit decrease, the passive components may limit the ability to continue to shrink the integrated circuit. Instead of using a CBC capacitor for each receiver, the input device may use a single CBC capacitor and use a plurality of current mirrors to source and/or sink the current required to correct the input voltage of the receivers in the device. Thus, instead of having a passive capacitor for each receiver channel, the input device uses a current-mode CBC circuit that includes only one passive capacitor and a plurality of current mirrors that may include digital circuit components (e.g., transistors) that require much less space on the integrated circuit than passive components.

In addition, the capacitance of the CBC capacitor may be shrunk relative to embodiments where current mirrors are not used. For example, to correct the input voltage at the receiver, a CBC circuit may require 10 pF of capacitance. Instead of adding a 10 pF capacitor, the current-mode CBC circuit may include a 1 pF capacitor and use a scaling factor on the respective current mirror to generate the same current that would have resulted if a 10 pF capacitor were used. Thus, a current-mode CBC circuit may require less space in an integrated circuit relative to other CBC circuits by reducing the number of passive capacitors as well as reducing the size of each passive capacitor used.

FIG. 1 is a block diagram of an exemplary input device 100, in accordance with embodiments of the present technology. Although embodiments of the present disclosure may be utilized in an input device 100 including a display device integrated with a sensing device, it is contemplated that the invention may be embodied in display devices without integrated sensing devices. The input device 100 may be configured to provide input to an electronic system 150. As used in this document, the term "electronic system" (or "electronic device") broadly refers to any system capable of electronically processing information. Some non-limiting examples of electronic systems include personal computers of all sizes and shapes, such as desktop computers, laptop computers, netbook computers, tablets, web browsers, e-book readers, and personal digital assistants (PDAs). Additional example electronic systems include composite input devices, such as physical keyboards that include input device 100 and separate joysticks or key switches. Further example electronic systems include peripherals such as data input devices (including remote controls and mice), and data output devices (including display screens and printers). Other examples include remote terminals, kiosks, and video game machines (e.g., video game consoles, portable gaming devices, and the like). Other examples include communication devices (including cellular phones, such as smart phones), and media devices (including recorders, editors, and players such as televisions, set-top boxes, music players, digital photo frames, and digital cameras). Additionally, the electronic system could be a host or a slave to the input device.

The input device 100 can be implemented as a physical part of the electronic system, or can be physically separate from the electronic system. As appropriate, the input device 100 may communicate with parts of the electronic system using any one or more of the following: buses, networks, and other wired or wireless interconnections. Examples include $I^2C$, SPI, PS/2, Universal Serial Bus (USB), Bluetooth, RF, and IRDA.

In FIG. 1, the input device 100 is shown as a proximity sensor device (also often referred to as a "touchpad" or a "touch sensor device") configured to sense input provided by one or more input objects 140 in a sensing region 120. Example input objects include fingers and styli, as shown in FIG. 1.

Sensing region 120 encompasses any space above, behind, around, in and/or near the input device 100 in which the input device 100 is able to detect user input (e.g., user input provided by one or more input objects 140). The sizes, shapes, and locations of particular sensing regions may vary widely from embodiment to embodiment. In some embodiments, the sensing region 120 extends from a surface of the input device 100 in one or more directions into space until signal-to-noise ratios prevent sufficiently accurate object detection. The distance to which this sensing region 120 extends in a particular direction, in various embodiments, may be on the order of less than a millimeter, millimeters, centimeters, or more, and may vary significantly with the type of sensing technology used and the accuracy desired. Thus, some embodiments sense input that comprises no contact with any surfaces of the input device 100, contact with an input surface (e.g. a touch surface) of the input device 100, contact with an input surface of the input device 100 coupled with some amount of applied force or pressure, and/or a combination thereof. In various embodiments, input surfaces may be provided by surfaces of casings within which the sensor electrodes reside, by face sheets applied over the sensor electrodes or any casings, etc. In some embodiments, the sensing region 120 has a rectangular shape when projected onto an input surface of the input device 100.

The input device 100 may utilize any combination of sensor components and sensing technologies to detect user input in the sensing region 120. The input device 100 comprises one or more sensing elements 121 for detecting user input. As several non-limiting examples, the input device 100 may use capacitive, elastive, resistive, inductive, magnetic, acoustic, ultrasonic, and/or optical techniques.

Some implementations are configured to provide images that span one, two, three, or higher dimensional spaces. Some implementations are configured to provide projections of input along particular axes or planes.

In some resistive implementations of the input device 100, a flexible and conductive first layer is separated by one or more spacer elements from a conductive second layer.

During operation, one or more voltage gradients are created across the layers. Pressing the flexible first layer may deflect it sufficiently to create electrical contact between the layers, resulting in voltage outputs reflective of the point(s) of contact between the layers. These voltage outputs may be used to determine positional information.

In some inductive implementations of the input device 100, one or more sensing elements 121 pick up loop currents induced by a resonating coil or pair of coils. Some combination of the magnitude, phase, and frequency of the currents may then be used to determine positional information.

In some capacitive implementations of the input device 100, voltage or current is applied to create an electric field. Nearby input objects cause changes in the electric field, and produce detectable changes in capacitive coupling that may be detected as changes in voltage, current, or the like.

Some capacitive implementations utilize arrays or other regular or irregular patterns of capacitive sensing elements 121 to create electric fields. In some capacitive implementations, separate sensing elements 121 may be ohmically shorted together to form larger sensor electrodes. Some capacitive implementations utilize resistive sheets, which may be uniformly resistive.

Some capacitive implementations utilize "self capacitance" (or "absolute capacitance") sensing methods based on changes in the capacitive coupling between sensor electrodes and an input object. In various embodiments, an input object near the sensor electrodes alters the electric field near the sensor electrodes, thus changing the measured capacitive coupling. In one implementation, an absolute capacitance sensing method operates by modulating sensor electrodes with respect to a reference voltage (e.g. system ground), and by detecting the capacitive coupling between the sensor electrodes and input objects.

Some capacitive implementations utilize "mutual capacitance" (or "transcapacitance") sensing methods based on changes in the capacitive coupling between sensor electrodes. In various embodiments, an input object near the sensor electrodes alters the electric field between the sensor electrodes, thus changing the measured capacitive coupling. In one implementation, a transcapacitive sensing method operates by detecting the capacitive coupling between one or more transmitter sensor electrodes (also "transmitter electrodes") and one or more receiver sensor electrodes (also "receiver electrodes"). Transmitter sensor electrodes may be modulated relative to a reference voltage (e.g., system ground) to transmit transmitter signals. Receiver sensor electrodes may be held substantially constant relative to the reference voltage to facilitate receipt of resulting signals. A resulting signal may comprise effect(s) corresponding to one or more transmitter signals, and/or to one or more sources of environmental interference (e.g. other electromagnetic signals). Sensor electrodes may be dedicated transmitter electrodes or receiver electrodes, or may be configured to both transmit and receive.

In FIG. 1, a processing system 110 is shown as part of the input device 100. The processing system 110 is configured to operate the hardware of the input device 100 to detect input in the sensing region 120. The processing system 110 comprises parts of or all of one or more integrated circuits (ICs) and/or other circuitry components. (For example, a processing system for a mutual capacitance sensor device may comprise transmitter circuitry configured to transmit signals with transmitter sensor electrodes, and/or receiver circuitry configured to receive signals with receiver sensor electrodes). In some embodiments, the processing system 110 also comprises electronically-readable instructions, such as firmware code, software code, and/or the like. In some embodiments, components composing the processing system 110 are located together, such as near sensing element(s) of the input device 100. In other embodiments, components of processing system 110 are physically separate with one or more components close to sensing element(s) of input device 100, and one or more components elsewhere. For example, the input device 100 may be a peripheral coupled to a desktop computer, and the processing system 110 may comprise software configured to run on a central processing unit of the desktop computer and one or more ICs (perhaps with associated firmware) separate from the central processing unit. As another example, the input device 100 may be physically integrated in a phone, and the processing system 110 may comprise circuits and firmware that are part of a main processor of the phone. In some embodiments, the processing system 110 is dedicated to implementing the input device 100. In other embodiments, the processing system 110 also performs other functions, such as operating display screens, driving haptic actuators, etc.

The processing system 110 may be implemented as a set of modules that handle different functions of the processing system 110. Each module may comprise circuitry that is a part of the processing system 110, firmware, software, or a combination thereof. In various embodiments, different combinations of modules may be used. Example modules include hardware operation modules for operating hardware such as sensor electrodes and display screens, data processing modules for processing data such as sensor signals and positional information, and reporting modules for reporting information. Further example modules include sensor operation modules configured to operate sensing element(s) to detect input, identification modules configured to identify gestures such as mode changing gestures, and mode changing modules for changing operation modes.

In some embodiments, the processing system 110 responds to user input (or lack of user input) in the sensing region 120 directly by causing one or more actions. Example actions include changing operation modes, as well as GUI actions such as cursor movement, selection, menu navigation, and other functions. In some embodiments, the processing system 110 provides information about the input (or lack of input) to some part of the electronic system (e.g. to a central processing system of the electronic system that is separate from the processing system 110, if such a separate central processing system exists). In some embodiments, some part of the electronic system processes information received from the processing system 110 to act on user input, such as to facilitate a full range of actions, including mode changing actions and GUI actions.

For example, in some embodiments, the processing system 110 operates the sensing element(s) of the input device 100 to produce electrical signals indicative of input (or lack of input) in the sensing region 120. The processing system 110 may perform any appropriate amount of processing on the electrical signals in producing the information provided to the electronic system. For example, the processing system 110 may digitize analog electrical signals obtained from the sensor electrodes. As another example, the processing system 110 may perform filtering or other signal conditioning. As yet another example, the processing system 110 may subtract or otherwise account for a baseline, such that the information reflects a difference between the electrical signals and the baseline. As yet further examples, the processing system 110 may determine positional information, recognize inputs as commands, recognize handwriting, and the like.

"Positional information" as used herein broadly encompasses absolute position, relative position, velocity, acceleration, and other types of spatial information. Exemplary "zero-dimensional" positional information includes near/far or contact/no contact information. Exemplary "one-dimensional" positional information includes positions along an axis. Exemplary "two-dimensional" positional information includes motions in a plane. Exemplary "three-dimensional" positional information includes instantaneous or average velocities in space. Further examples include other representations of spatial information. Historical data regarding one or more types of positional information may also be determined and/or stored, including, for example, historical data that tracks position, motion, or instantaneous velocity over time.

In some embodiments, the input device 100 is implemented with additional input components that are operated by the processing system 110 or by some other processing system. These additional input components may provide redundant functionality for input in the sensing region 120, or some other functionality. FIG. 1 shows buttons 130 near the sensing region 120 that can be used to facilitate selection of items using the input device 100. Other types of additional input components include sliders, balls, wheels, switches, and the like. Conversely, in some embodiments, the input device 100 may be implemented with no other input components.

In some embodiments, the input device 100 comprises a touch screen interface, and the sensing region 120 overlaps at least part of an active area of a display screen of the display device 101. For example, the input device 100 may comprise substantially transparent sensor electrodes overlaying the display screen and provide a touch screen interface for the associated electronic system. The display screen may be any type of dynamic display capable of displaying a visual interface to a user, and may include any type of light emitting diode (LED), organic LED (OLED), cathode ray tube (CRT), liquid crystal display (LCD), plasma, electroluminescence (EL), electrowetting, MEMS, or other display technology. The input device 100 and the display device 101 may share physical elements. For example, some embodiments may utilize some of the same electrical components for displaying and sensing. As another example, the display device 101 may be operated in part or in total by the processing system 110.

It should be understood that while many embodiments of the present technology are described in the context of a fully functioning apparatus, the mechanisms of the present technology are capable of being distributed as a program product (e.g., software) in a variety of forms. For example, the mechanisms of the present technology may be implemented and distributed as a software program on information bearing media that are readable by electronic processors (e.g., non-transitory computer-readable and/or recordable/writable information bearing media readable by the processing system 110). Additionally, the embodiments of the present technology apply equally regardless of the particular type of medium used to carry out the distribution. Examples of non-transitory, electronically readable media include various discs, memory sticks, memory cards, memory modules, and the like. Electronically readable media may be based on flash, optical, magnetic, holographic, or any other storage technology.

Figure 2:
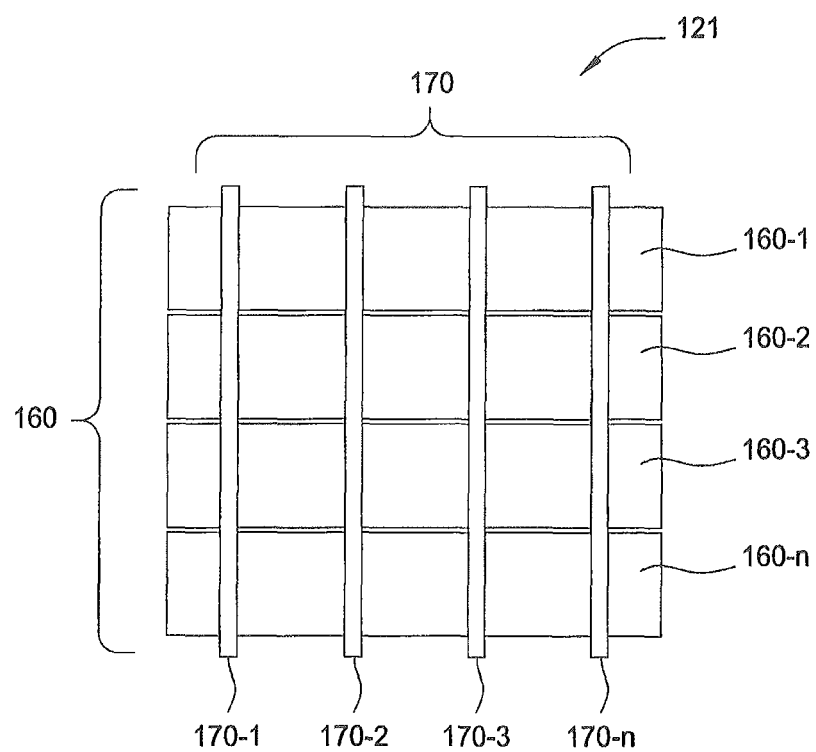
FIG. 2 illustrates a stack-up of a sensor assembly that may be used in the input device to sense the input object, according to an embodiment described herein.

FIG. 2 shows a portion of an exemplary pattern of sensing elements 121 configured to sense in a sensing region associated with the pattern, according to some embodiments. For clarity of illustration and description, FIG. 2 shows the sensing elements 121 in a pattern of simple rectangles, and does not show various components. This pattern of sensing elements 121 comprises a first plurality of sensor electrodes 160 (160-1, 160-2, 160-3, 160-n), and a second plurality of sensor electrodes 170 (170-1, 170-2, 170-3, . . . 170-n) disposed over the plurality of transmitter electrodes 160. In one embodiment, this pattern of sensing elements 121 comprises a plurality of transmitter electrodes 160 (160-1, 160-2, 160-3, . . . 160-n), and a plurality of receiver electrodes 170 (170-1, 170-2, 170-3, . . . 170-n) disposed over the plurality of transmitter electrodes 160. In another embodiment, the first plurality of sensor electrodes may be configured to transmit and receive and the second plurality of sensor electrodes may also be configured to transmit and receive.

Transmitter electrodes 160 and receiver electrodes 170 are typically ohmically isolated from each other. That is, one or more insulators separate transmitter electrodes 160 and receiver electrodes 170 and prevent them from electrically shorting to each other. In some embodiments, transmitter electrodes 160 and receiver electrodes 170 are separated by insulative material disposed between them at cross-over areas; in such constructions, the transmitter electrodes 160 and/or receiver electrodes 170 may be formed with jumpers connecting different portions of the same electrode. In some embodiments, transmitter electrodes 160 and receiver electrodes 170 are separated by one or more layers of insulative material. In some other embodiments, transmitter electrodes 160 and receiver electrodes 170 are separated by one or more substrates; for example, they may be disposed on opposite sides of the same substrate, or on different substrates that are laminated together. Moreover, although not shown, in other embodiments the electrodes 160 and 170 may be located on the same surface or plane.

The areas of localized capacitive coupling between transmitter electrodes 160 and receiver electrodes 170 may be termed "capacitive pixels." The capacitive coupling between the transmitter electrodes 160 and receiver electrodes 170 change with the proximity and motion of input objects in the sensing region associated with the transmitter electrodes 160 and receiver electrodes 170.

In some embodiments, the sensor pattern is "scanned" to determine these capacitive couplings. That is, the transmitter electrodes 160 are driven to transmit transmitter signals. Transmitters may be operated such that one transmitter electrode transmits at one time, or multiple transmitter electrodes transmit at the same time. Where multiple transmitter electrodes transmit simultaneously, these multiple transmitter electrodes may transmit the same transmitter signal and effectively produce an effectively larger transmitter electrode, or these multiple transmitter electrodes may transmit different transmitter signals. For example, multiple transmitter electrodes may transmit different transmitter signals according to one or more coding schemes that enable their combined effects on the resulting signals of receiver electrodes 170 to be independently determined.

The receiver sensor electrodes 170 may be operated singly or multiply to acquire resulting signals. The resulting signals may be used to determine measurements of the capacitive couplings at the capacitive pixels.

A set of measurements from the capacitive pixels form a "capacitive image" (also "capacitive frame") representative of the capacitive couplings at the pixels. Multiple capacitive images may be acquired over multiple time periods, and differences between them used to derive information about input in the sensing region. For example, successive capacitive images acquired over successive periods of time can be used to track the motion(s) of one or more input objects entering, exiting, and within the sensing region.

The background capacitance of a sensor device is the capacitive image associated with no input object in the sensing region. The background capacitance changes with the environment and operating conditions, and may be estimated in various ways. For example, some embodiments take "baseline images" when no input object is determined to be in the sensing region, and use those baseline images as estimates of their background capacitances.

Capacitive images can be adjusted for the background capacitance of the sensor device for more efficient processing. Some embodiments accomplish this by "baselining" measurements of the capacitive couplings at the capacitive pixels to produce a "baselined capacitive image." That is, some embodiments compare the measurements forming a capacitance image with appropriate "baseline values" of a "baseline image" associated with those pixels, and determine changes from that baseline image.

In some touch screen embodiments, transmitter electrodes 160 comprise one or more common electrodes (e.g., "V-corn electrode" or source drive electrode) used in updating the display of the display screen. These common electrodes may be disposed on an appropriate display screen substrate. For example, the common electrodes may be disposed on the TFT glass in some display screens (e.g., In Plane Switching (IPS) or Plane to Line Switching (PLS)), on the bottom of the color filter glass of some display screens (e.g., Patterned Vertical Alignment (PVA) or Multi-domain Vertical Alignment (MVA)), etc. In such embodiments, the common electrode can also be referred to as a "combination electrode", since it performs multiple functions. In various embodiments, each transmitter electrode 160 comprises one or more common electrodes. In other embodiments, at least two transmitter electrodes 160 may share at least one common electrode.

In various touch screen embodiments, the "capacitive frame rate" (the rate at which successive capacitive images are acquired) may be the same or be different from that of the "display frame rate" (the rate at which the display image is updated, including refreshing the screen to redisplay the same image). In some embodiments where the two rates differ, successive capacitive images are acquired at different display updating states, and the different display updating states may affect the capacitive images that are acquired. That is, display updating and/or the resulting display state affect, in particular, the background capacitive image. Thus, if a first capacitive image is acquired when the display updating is at a first state, and a second capacitive image is acquired when the display updating is at a second state, the first and second capacitive images may differ due to differences in the background capacitive image associated with the display updating states, and not due to changes in the sensing region. This is more likely where the capacitive sensing and display updating electrodes are in close proximity to each other, or when they are shared (e.g. combination electrodes). In various embodiments, the capacitive frame rate is an integer multiple of the display frame rate. In other embodiments, the capacitive frame rate is a fractional multiple of the display frame rate. In yet further embodiments, the capacitive frame rate may be any fraction or integer of the display frame rate.

For convenience of explanation, a capacitive image that is taken during a particular display updating state is considered to be of a particular frame type. That is, a particular frame type is associated with a mapping of a particular capacitive sensing sequence with a particular display sequence. Thus, a first capacitive image taken during a first display updating state is considered to be of a first frame type, a second capacitive image taken during a second display updating state is considered to be of a second frame type, a third capacitive image taken during a first display updating state is considered to be of a third frame type, and so on. Where the relationship of display update state and capacitive image acquisition is periodic, capacitive images acquired cycle through the frame types and then repeats. In some embodiments, there may be "n" capacitive images for every display updating state.

Current-Mode Coarse-Baseline-Correction Circuit

Figure 3:
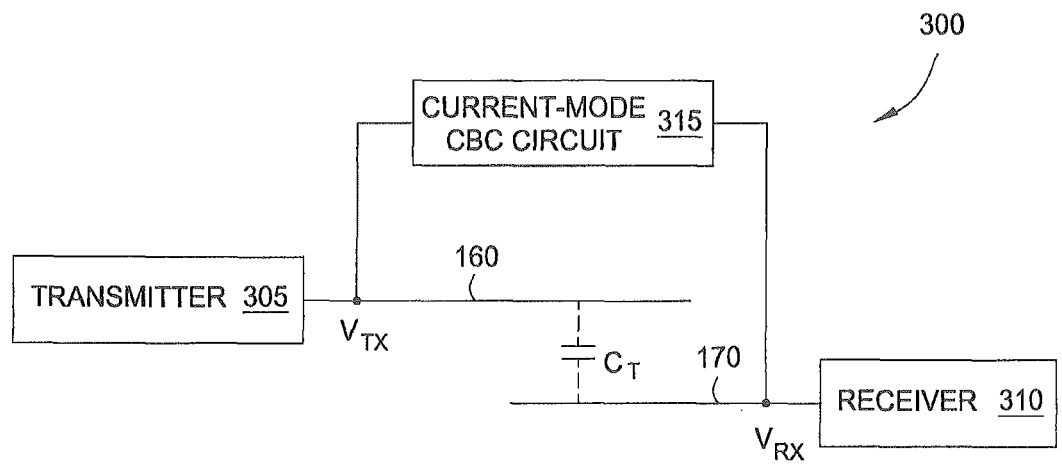
FIG. 3 is a circuit model of an input device including a current-mode coarse-baseline-correction circuit, according to an embodiment described herein.

FIG. 3 is a circuit model of an input device including a current-mode coarse-baseline-correction (CBC) circuit, according to an embodiment described herein. Circuit 300 includes a transmitter 305 coupled to a transmitter electrode 160, a receiver 310 coupled to a receiver electrode 170 and a current-mode CBC circuit 315. The transmitter 305 and receiver 310 may be any circuit that performs the functions described herein. Moreover, although not shown, the transmitter electrode 160 may also be coupled to a receiver while the receiver electrode 170 may also be coupled to a transmitter.

During capacitive sensing, the transmitter 305 drives a transmitter signal onto the transmitter electrode 160. Because the transmitter electrode 160 is in close proximity to the receiver electrode 170, the two electrodes are capacitively coupled as shown by $C_T$. The two electrodes 160, 170 may be located on the same surface, on different sides of the same substrate, or on different substrates. Moreover, one or both of the electrodes 160, 170 may be integrated into a display device and be used when updating a displayed image.

The capacitive coupling causes the transmitter signal to generate the resulting signal on the receiver electrodes 170. As an input object moves closer to the electrodes 160, 170, the object may affect the resulting signal which is detected by the receiver 310 as discussed above. Circuit 300 also includes the CBC circuit 315 for compensating for the change in the voltage at the input of the receiver 310 (i.e., $V_{RX}$) caused by driving the transmitter signal on the transmitter electrode 160. For example, in order to provide more headroom to lessen the likelihood that interfering signals may prevent the receiver 310 from detecting user interaction with the input device, the CBC circuit may source and/or sink a current at the input of receiver 310 that is based on the current sourced and/or sunk by transmitter 305 on the transmitter electrode 160. As will be discussed in greater detail below, the current-mode CBC circuit 315 may include an effective capacitance that is similar to the coupling capacitance $C_T$. Using the voltage at the output of the transmitter 305 ($V_{TX}$) as an input signal, the CBC circuit 315 provides at its output a current that compensates for the effects of the transmitter signal on the input receiver voltage $V_{RX}$. For example, if the transmitter signal would cause the voltage $V_{RX}$ to rise from VDD/2 to 3*VDD/4, the current-mode CBC circuit 315 may sink a current that maintains $V_{RX}$ at VDD/2. To do so, the CBC circuit 315 may include at least one passive capacitor and a current mirror that outputs a current according to the voltage value at $V_{TX}$.

If, while driving the transmitter signal, an input object comes within close proximity to the electrodes 160, 170 (e.g., the input object contacts or is proximate to the sensing region 120 shown in FIG. 1), the voltage $V_{RX}$ may change.

That is, the CBC circuit 315 may compensate for the voltage change caused only by the transmitter signal in the absence of the input object. For example, assuming the transmitter signal is a square wave, the presence of the input object may cause $V_{RX}$ to fluctuate from 1.8 V to 2.2 V, but when the input object moves away from the sensing region, $V_{RX}$ may remain substantially fixed e.g., 2.0 V. In this manner, the receiver 310 may reserve the voltage headroom that may have otherwise been used by the voltage changes caused by the transmitter signal for other uses such as reducing the likelihood an interfering signal from, e.g., an external power supply or RF source, will prevent the receiver 310 from detecting the input object.

Although the present embodiments are described in the context of transcapacitive (or mutual) sensing where a transmitting signal is driven onto a transmitter electrode and a resulting signal is measured at a receiver, the disclosure also applies to absolute capacitance sensing. In this case, for example, the current conveyor may be used to cancel out the change in charge resulting from transmitting a modulating signal onto the sensor electrode.

Figure 4:
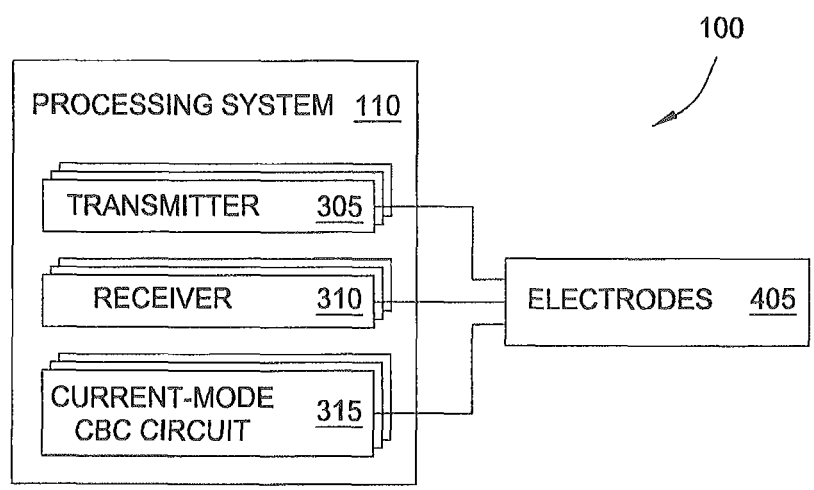
FIG. 4 is a schematic block diagram of an processing system with a current-mode coarse-baseline-correction circuit, according to an embodiment described herein.

FIG. 4 is a schematic block diagram of the processing system 110 incorporating the current-mode CBC circuit 315, according to an embodiment described herein. In input device 100, the transmitters 305, receivers 310, and current mode CBC circuits 315 are located within the same processing system 110. As discussed above, the processing system 110 is configured to operate the hardware of the input device to detect user input in the sensing region. The processing system 110 comprises parts of or all of one or more integrated circuits (ICs) and/or other circuitry components. Thus, as shown here, the transmitters 305, receivers 310, and CBC circuits 315 may be located on the same IC on a plurality of ICs.

The processing system 110 is coupled to electrodes 405 which may include the transmitter electrodes and receiver electrodes discussed above. In the shown embodiment, the electrodes are located external from the processing system 110. Nonetheless, the processing system 110 and electrodes may be located in the same input device or mounted on a shared substrate. In one embodiment, the processing system 110 may include a respective CBC circuit 315 for each transmitter 305. However, in another embodiment, the processing circuit 110 may include a single CBC circuit 315 that is used to compensate for the change in charge at the receivers 310 caused by the transmitters 305. A more detailed explanation of these two embodiments is provided below.

Figure 5:
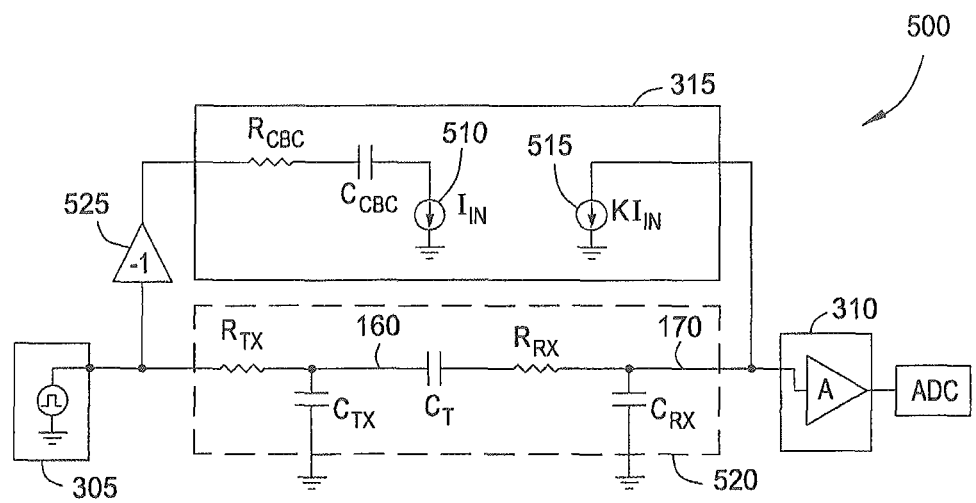
FIG. 5 is a circuit diagram of a current-mode coarse-baseline-correction circuit with a current mirror, according to an embodiment described herein.

FIG. 5 is a circuit diagram 500 of a current-mode CBC circuit 315 with a current mirror 515, according to an embodiment described herein. The CBC circuit 315 includes a resistance element $R_{CBC}$, a capacitor $C_{CBC}$, current sensor 510, and current mirror 515. The $R_{CBC}$ and $C_{CBC}$ of the CBC circuit 315 may be programmable or adjustable to substantially match a sensor 520 time constant which includes the coupling capacitance $C_T$ between the transmitter and receiver electrodes, transmitter and receiver electrode resistances $R_{TX}$ and $R_{RX}$, and the background capacitances $C_{TX}$ and $C_{RX}$ associated with the electrodes. Doing so means that charge transferred through the CBC circuit 315 is substantially aligned in time to the charge transferred through the sensor electrodes 160, 170 in sensor 520. Because the inverting buffer 525 inverts the transmitter signal (which is shown here as a square wave but is not limited to such), whatever charge is transferred from the transmitter electrode 160 to the receiver electrode 170, the same amount of charge flows from the input of the receiver 310 to the CBC circuit 315 thereby leaving the voltage on the receiver electrode 160 and the voltage at the input of the receiver 310 substantially unchanged. Mitigating the effect of the transmitter signal on the input voltage of the receiver 310 may improve the dynamic range of the receiver 310 and enable the receiver 310 to linearly handle interfering signals and noise. Further still, if the charge transferred through $C_{CBC}$ is the negative of the charge transferred through $C_T$, the analog-to-digital converters (ADC) can be placed at center code which allows for symmetrical ADC reference channel voltages and may increase the number of codes that can be used to detect the presence of an input object.

In one embodiment, the resistance $R_{CBC}$ and capacitance $C_{CBC}$ may be adjusted when manufacturing the input device. For example, the values of the sensor resistances $R_{TX}$ and $R_{AX}$ and the capacitances $C_{TX}$, $C_{RX}$, and $C_T$ may already be known either via testing the input device or these values be provided by the manufacturer who supplies the sensor electrodes. Based on these values, the $R_{CBC}$ and $C_{CBC}$ values may be adjusted using, for example, digital control bits, to provide a similar time constant to the CBC circuit 315 thereby synchronizing the electrical path through the CBC circuit with the electrical path through the sensor electrodes 160, 170.

Additionally, the resistance $R_{CBC}$ and/or capacitance $C_{CBC}$ may be dynamically adjusted when operating the input device. For example, the value $C_T$ may change based on environmental conditions such as moisture forming on a display screen proximate to the sensors 160, 170. The circuit 500 may periodically re-measure the value of $C_T$ and adjust the values of $R_{CBC}$ and $C_{CBC}$. Moreover, $R_{CBC}$ and/or $C_{CBC}$ may be adjusted for other reasons regardless whether the time constant associated with the sensor 520 changes. For example, it may be advantageous to adjust $R_{CBC}$ and/or $C_{CBC}$ to test the integral and differential nonlinearities of the ADCs.

As shown, the current mirror 515 mirrors the current ($I_{IN}$) flowing through the current sensor 510. More specifically, the current mirror 515 scales the current $I_{IN}$ by a factor K. In one embodiment, the current mirror is programmable or adjustable such that the factor K (e.g., an integer, fractional, or irrational value) may be changed as desired. For example, if K is set to 10, then a 1 mA current flowing through current sensor 510 results in a 10 mA current outputted by the current mirror 515. Similarly, a charge of one pico-Coulomb injected into current sensor 510 results in ten pico-Coulombs being absorbed by current mirror 515.

By using the current mirror 515, the current-mode CBC circuit 315 may require less space in an IC than other types of CBC circuits. For example, if $C_{CBC}$ was directly connected to the input of the receiver 310 rather than indirectly via the current sensor 510 and mirror 515, the capacitance value of the $C_{CBC}$ may have to be substantially equal to the combined capacitance value of sensor 520. However, the scaling factor K of the current mirror 515 instead enables the capacitor $C_{CBC}$ to have a smaller capacitance than the capacitance of $C_T$ and still provide an equal, but reverse charge, at the input of the receiver 310. For example, if the capacitance of $C_T$ is 10 pF, the $C_{CBC}$ may be 1 pF and the scale factor K may be set to 10 thereby generating a current equal to a CBC circuit that instead used a 10 pF $C_{CBC}$. In this manner, the scaling factor K of the current mirrors 515 produce effective capacitances that can be much larger than the value of capacitor $C_{CBC}$. Sourcing (or sinking) this scaled current compensates for the change in charge at the input of the receiver 310 caused by the transmitter signal. Moreover, the current-mode CBC circuit 315 uses a capacitor $C_{CBC}$ that is smaller (as scaled by K) than would otherwise be required. Although the CBC circuit 315 includes the current sensor 510 and current mirror 515, the total area required on an IC for these digital circuits and the passive capacitor $C_{CBC}$ (e.g., a 1 pF capacitor) may be less than the area required by a CBC circuit that uses a larger capacitor $C_{CBC}$ (e.g., a 10 pF capacitor) but does not include the current sensor 510 and mirror 515.

In one embodiment, $C_{CBC}$ is a bank of passive capacitors that may be adjustably connected to provide different values of $C_{CBC}$. For example, two 1 pF $C_{CBC}$ capacitors may be selectively coupled in series to yield 0.5 pF or in parallel to yield 2 pF of capacitance. The capacitors in the bank of capacitors may have the same capacitance values or differing capacitance values. In this manner, the CBC circuit 315 may dynamically adjust the capacitance value of $C_{CBC}$, the scaling factor K, or both.

In addition to reducing to size of the capacitor $C_{CBC}$, the current-mode CBC circuit 315 may reduce the number of total capacitors needed relative to a CBC circuit that does include a current mirror. Using just one passive capacitor $C_{CBC}$ (or one bank of passive capacitors), the current-mode CBC circuit 315 may perform coarse-baseline-correction for a plurality of receiver channels using a plurality of current mirrors. In contrast, without the current mirrors, other CBC circuits may require a separate CBC capacitor or a separate bank of CBC capacitors for each receiver in the input device. Using only one CBC capacitor and a plurality of current mirrors in the CBC circuit 315 may require less space and reduce costs compared to using respective passive capacitors for each receiver channel.

Figure 6:
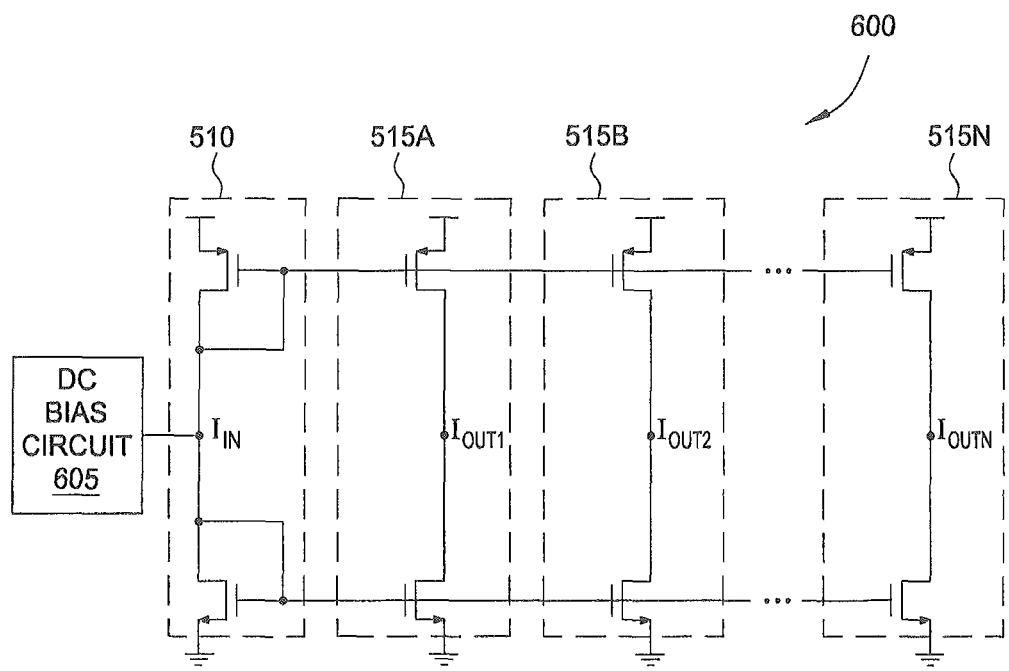
FIG. 6 is a circuit diagram of a current-mode coarse-baseline-correction circuit with a plurality of current mirrors, according to an embodiment described herein.

FIG. 6 is a circuit diagram of a portion of a current-mode CBC circuit having a plurality of current mirrors 515, according to an embodiment described herein. Specifically, the circuit diagram 600 is an exemplary implementation of the current sensor 510 and current mirror 515 shown in FIG. 5. The CBC circuit diagram 600 (e.g., a current conveyor) includes a node (labeled as $I_{IN}$) that is coupled to the capacitor $C_{CBC}$ shown in FIG. 5. The current sensor 510 detects a current associated with the capacitor $C_{CBC}$ which is then replicated and scaled by each of the current mirrors 515 according to:

$$I_{OUTX} = K_X * I_{IN} \text{ where } X=1,2,3,\ldots,N. \quad (1)$$

In one embodiment, each of the current mirrors 515 may have an individually programmable scaling factor $K_X$ which may be customized to match the properties of the electrical path that corresponds to the particular current mirrors 515. For example, an input device may include twenty receivers and thus, the CBC circuit portion 600 may include twenty current mirrors 515 for correcting the charge at the input of each of these receivers. However, the electrical paths associated with these receivers may be different. Specifically, the resistance and capacitance values of the sensor between the transmitter and a receiver in one electrical path may differ from the resistances and capacitance values between the transmitter and another receiver. As such, the scaling factor K allows the current mirrors 515 to be adjusted to match the electrical properties of their respective receiver channels. For example, if the electrical path between the transmitter and the receiver coupled to current mirror 515A has a different capacitive value than the electrical path between the transmitter and the receiver coupled to current mirror 515B, these two current mirrors may have different scaling factors $K_1$ and $K_2$ in order to match the charge flowing through the CBC circuit with the charge flowing between the transmitter and their respective receivers. In one embodiment, the scaling factors K may be adjusted using digital control bits. Adjusting each scaling factor $K_{IN}$ compensates for each one of multiple $C_T$ values. The values of $C_T$ between each receiver electrode and each transmitter electrodes are in general, different. By adjusting the value of $K_{IN}$ corresponding to each such $C_T$, each $C_T$'s effects may be mitigated.

Moreover, the CBC circuit portion 600 illustrates that only one input current $I_{IN}$ is needed in order to generate any number of output currents $I_{OUTN}$. Thus, only one passive capacitor or bank of capacitors is needed in the CBC circuit to perform coarse-baseline-correction on all the capacitive sensing receivers capacitively coupled to one or more transmitter electrodes. Doing so may reduce costs and reduce the area the CBC circuit 600 uses on an integrated circuit.

The DC bias circuit 605 may be used in the current conveyor to set a desired DC voltage at the node labeled $I_{IN}$—i.e., the node coupled to the passive capacitor $C_{CBC}$. In one embodiment, the DC bias circuit 605 may be translinear loop that sets the DC voltage at node $I_{IN}$. Alternatively, the DC bias circuit 605 may be a voltage mode amplifier with a unity gain feedback. Nonetheless, the embodiments described herein are not limited to any particular circuit for setting the DC voltage for the CBC circuit portion 600.

Figure 7:
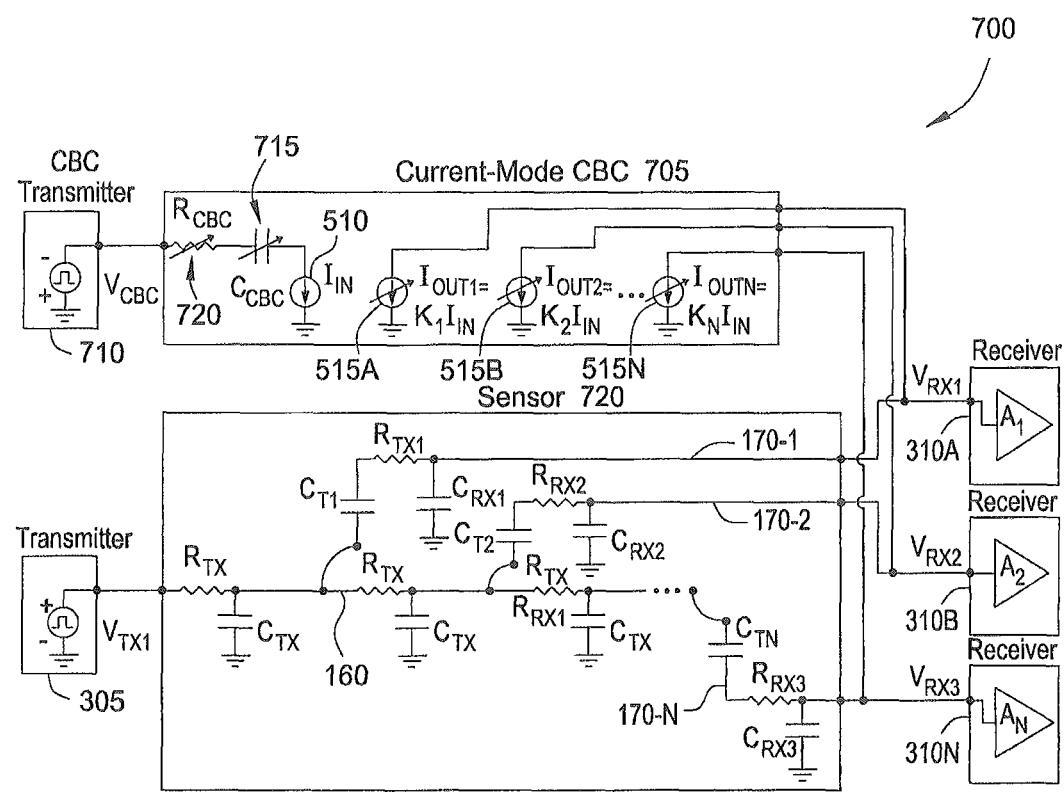
FIG. 7 is a circuit diagram illustrating the use of a plurality of current mirrors to perform coarse-baseline-correction at a plurality of receivers, according to an embodiment described herein.

FIG. 7 is a circuit diagram 700 illustrating the use of a plurality of current mirrors 515 to perform coarse-baseline-correction at a plurality of receivers 310, according to an embodiment described herein. Specifically, circuit 700 illustrates using the current conveyor discussed in FIG. 6 to perform coarse-baseline-correction at the plurality of receivers 310A-N. As shown, the transmitter 305 drives a capacitive sensing signal onto the transmitter electrode 160 of the sensor 720. As shown here, sensor 720 illustrates the interaction between the transmitter electrode 160 and a plurality of receiver electrodes 170 where performing capacitive sensing. In the embodiment shown, the transmitter electrode 160 may be proximate to a plurality of receiver electrodes 170-1, 170-2 . . . 170-N in the sensor 720. These electrodes may only be capacitively coupled (e.g., the electrodes 160, 170 may be separated by an insulative material) as represented by the curved lines which couple the transmitter electrode 160 to the various receiver electrodes 160. For example, the receiver electrodes 170 may overlap or intersect the transmitter electrode 160 at various points that each defines a coupling capacitance $C_T$ (e.g., $C_{T1}$, $C_{T2}$ . . . $C_{TN}$) between the two electrodes. The sensor 720 is based on the electrode layout shown in FIG. 2, however, the present disclosure is not limited to such. In another embodiment, the transmitter and receiver electrodes 160 and 170 may be located on a common plane. For example, the electrodes 160, 170 may form a matrix pattern where the electrodes are block electrodes that are ohmically isolated from each other. In this example, the transmitter 305 may drive the transmitter signal onto a first one of the block electrodes while the receivers 310 measure a resulting signal on one or more of the block electrodes proximate to the first electrode—e.g., the block electrodes surrounding the first block electrode in the matrix pattern. Thus, the current-mode CBC circuit 705 may be used in embodiments where the sensor electrodes are located on a common surface or are distributed across multiple surfaces in an input device.

Sensor 720 illustrates a separate electrical path between the transmitter 305 and each of the receivers 310. As discussed above, these electrical paths may have similar resistance and capacitive values or the values may differ. For example, a first electrical path between transmitter 305 and receiver 310A may yield a different time constant that a second path between transmitter 305 and receiver 310B.

Illustratively, the first electrical path includes one resistance $R_{TX}$ and one capacitance $C_{TX}$ but the second electrical path includes two $R_{TX}$ values and two $C_{TX}$ value which may generate a different time constant because the first electrical path extends along a shorter portion of the transmitter electrode 160 than the second electrical path. The scaling factors of the respective current mirrors 515 coupled to each receiver 310 may also be adjusted or programmed. For example, the scaling factor $K_1$ of current mirror 515A coupled to receiver 310A may be set differently than the scaling factor $K_2$ of current mirror 515B coupled to receiver 310B. Even though both current mirrors use the same capacitor $C_{CBC}$ 715, the programmable scaling factors applies a different effective capacitance $C_{CBC}$ to each receiver channel to scale the charge accordingly.

In another example, the scaling factors may be used to apply a different effective $C_{CBC}$ to each receiver channel even if the lengths of the electrical paths are the same. For example, because of manufacturing variances or design preferences, the electrodes may have different sizes which may slightly vary their respective resistances and capacitances. Using the matrix electrode layout as an example, the lengths of electrical paths from the transmitter electrodes 160 to the surrounding receiver electrodes 170 may be the same; however, the electrodes may have different shapes which alter the coupling capacitance $C_T$ between the transmitter and receiver electrodes 160, 170. The scaling factors K may be used to account for these differences. Moreover, the scaling factors may be dynamically adjusted to account for environmental conditions (e.g., water, electrical interference, etc.) that may change the characteristics of the electrical paths in sensor 720.

The input device may adjust the programmable resistance $R_{CBC}$ 720 and/or capacitor $C_{CBC}$ 715 (e.g., a programmable bank of capacitors). For example, the input device may initially adjust the $R_{CBC}$ and $C_{CBC}$ values to a desired value and then use the scaling factors to set the desired effective capacitance for each receiver channel. However, in other embodiments, the resistance $R_{CBC}$ 720 and/or the capacitance $C_{CBC}$ 715 may be fixed values.

Generally, the current-mode CBC circuit 705 uses the current mirrors 515 to generate a current that compensates for the charges transferred to or from the inputs of the receivers 310 caused by the transmitter 305 driving the transmitter signal onto the sensor 720. To do so, the CBC transmitter 710 may provide a compensation signal that is inverted relative to the transmitter signal outputted by transmitter 305. For example, if the transmitter signal is a square wave, the CBC transmitter 710 may output a square wave that is inverted—e.g., 180 degree phase shift—relative to the transmitter signal. The CBC transmitter 710 may be a separate driver circuit that is synchronized (e.g., uses the same clock signal) as transmitter 305 or may be directly connected to the transmitter 305. For example, the CBC transmitter 710, in one embodiment, may be an inverting buffer coupled to the output of transmitter 305 as shown in FIG. 5. Moreover, although a square wave is shown as the transmitter signal, the present disclosure is not limited to such and may use a capacitive sensing signal with any desired shape or frequency.

In one embodiment, the input device may include a CBC circuit 705 for each transmitter 305 or transmitter electrode 160. Each of the CBC circuits 705 may then include respective current mirrors for compensating for the change in charge at the input of the receivers 310—i.e., each CBC circuit 705 is coupled to every receiver 310 in the input device. However, in other embodiments, the input device may include only a single CBC circuit that is selectively coupled to each transmitter 305. For example, assume that the input device drives the transmitter signal only on one of the transmitter electrodes 160 (or a group of transmitter electrodes 160) at a time. If the transmitter signal is currently driven onto electrode 160-1, the scaling factors K on the current mirrors 515 may be adjusted to match the particular electrical properties associated with electrode 160-1 and the receiver electrodes 170. However, when driving the transmitter signal on electrode 160-2 (or a second group of electrodes), the variable $R_{CBC}$, $C_{CBC}$, and/or scaling factors may be adjusted to match the electrical properties associated with electrode 160-2 and the receiver electrodes 170, and so forth. In some input devices, however, the electrical properties on the sensors may be close enough that a single CBC circuit may be used but that the variable $R_{CBC}$, $C_{CBC}$, and/or scaling factors do not need to change—e.g., the scaling factors may remain the same when driving the transmitter signal on the various transmitter electrodes 160. Using a single CBC circuit may be advantageous when compared to using a CBC circuit for each transmitter since using a single CBC means only one passive capacitor (or one programmable bank of capacitors) is needed to perform coarse-baseline-correction rather than using one passive capacitor or bank of capacitors for each transmitter in the input device.

Summing Receiver Outputs

Figure 8:
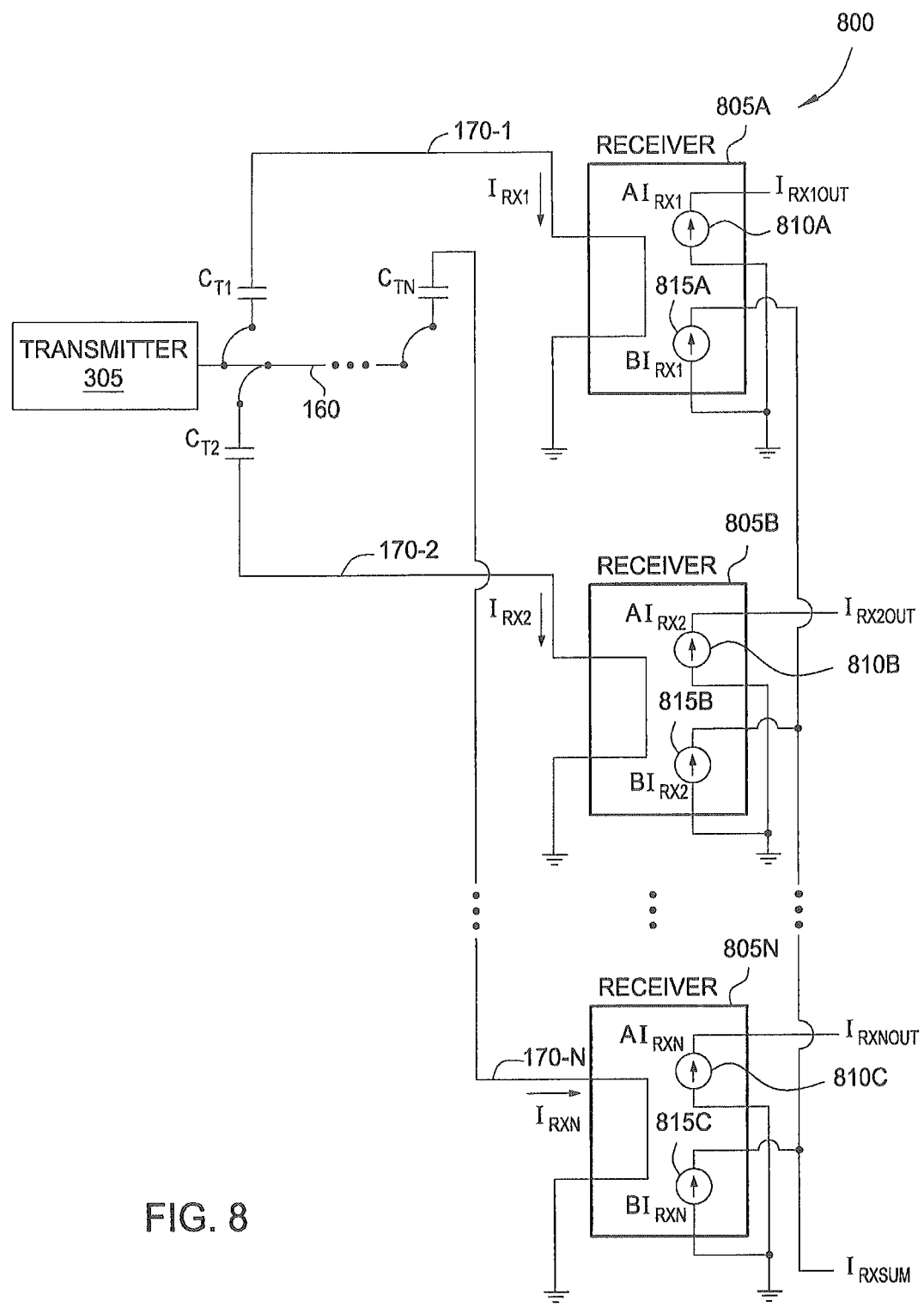
FIG. 8 is a circuit diagram of mirroring and summing receiver output currents, according to one embodiment described herein.

FIG. 8 is a circuit diagram 800 of mirroring and summing receiver output currents, according to one embodiment described herein. The transmitter 305 may drive a transmitter signal for capacitive sensing onto the transmitter electrode 160 which is capacitively coupled to one or more receiver electrodes 170 as shown by the capacitances $C_{T1}$-$C_{TN}$. The resulting signals, shown here as $I_{RX1}$-$I_{RXN}$, are received at the receivers 805. Each receiver 805 includes two current mirrors 810 and 815 which scale the resulting signal $I_{RX}$. Both current mirrors may multiple the respective resulting signal $I_{RX}$ by a scaling factor A or B. Although the scaling factors are shown as being different, in some situations they may the same. Moreover, in one embodiment, the scaling factors may be programmable. As such, the scaling factors for current mirrors 810A, B, and C may all be different.

The output currents $I_{RX1OUT}$, $I_{RX2OUT}$, and $I_{RXNOUT}$ may be sent to an ADC which outputs digital data that may be used by the input device to determine whether an input object is proximate to a sensing region where the transmitter electrode 160 intersects one of the transmitter electrodes 170. For example, the output $I_{RX1OUT}$ of receiver 805A may indicate whether the input object is proximate to the area of the sensing region where electrode 160 is capacitively coupled to electrode 170-1, the output $I_{RX2OUT}$ of receiver 805B may indicate whether the input object is proximate to where electrode 160 is capacitively coupled to electrode 170-2, and so forth.

In addition to providing an output current for gathering capacitive sensing data for each receiver 805, the circuit 800 is arranged for summing the currents outputted by each receiver 805. Specifically, the outputs of each current mirror 815 are connected to a shared node, thereby summing the currents to yield $I_{RXSUM}$. Doing so provides data that can be used for a variety of purposes in the input device. For example, in one embodiment, the output $I_{RXSUM}$ may be used to determine if there is an interferer that is injecting noise into the input device at a certain frequency. Using output $I_{RXSUM}$, the input device may perform a Fourier transform to identify the frequency of an interferer. The input device may then change its frequency used for the transmitter signal in order to reduce noise.

In one example, the output $I_{RXSUM}$ may be transmitted to a wide bandwidth channel that contains an ADC that is faster than ADC associated with each receiver 805. Using a wide bandwidth channel may make it easier for the input device to detect interferers that have some quadrature component that is similar to the sensing frequency used for capacitive sensing. Advantageously, only the wide bandwidth channel needs a fast ADC rather than each receiver needing the fast ADC.

In another embodiment, the output $I_{RXSUM}$ may be used in a low power state. Instead of scanning the entire sensing region, the input device may drive the transmitter signal onto the transmitter electrodes 160 simultaneously. The resulting output $I_{RXSUM}$ may be used to determine if the input object is interacting with any portion of the sensing region. If so, the input device may switch from the low power state to a normal mode of operation. For example, the $I_{RXSUM}$ may be used to wake up the input device from a sleep mode. Once the device wakes up, the input device may begin using the current mirrors 810 to gather individual data associated with the respective receivers 805 rather than using the summed output $I_{RXSUM}$.

The circuit 800 may be used in conjunction with the current-mode CBC circuit described above in FIGS. 3-7 or may be used independent of any CBC circuit. That is, using current mirrors to generate a summed output current may be useful regardless of whether the input device includes a current-mode CBC circuit as described above.

CONCLUSION

The embodiments herein are generally directed to using a current-mode CBC circuit to maintain a voltage bias setting at a receiver when performing capacitive sensing. For example, a transmitter may drive a transmitter signal used for capacitive sensing onto a transmitter electrode in an input device. Because of capacitive coupling, the transmitter signal may generate a resulting signal on a receiver electrode which may change the voltage bias at the input of a receiver. If an interfering signal adds additional voltage (i.e., noise) onto the receiver electrode, the voltage may exceed the rail voltages of the receiver, and thus, any change in voltage caused by an input object (e.g., a touch event) may be missed by the receiver.

Instead, the input device may include a CBC circuit that maintains (or corrects) the voltage at the input of the receiver. To do so, the CBC circuit may compensate for the change in voltage at the receiver resulting from driving the transmitter signal on the transmitter electrode. In one embodiment, the CBC circuit may source and/or sink current at the input of the receiver in order to maintain the receiver voltage at its predetermined bias point even as the transmitter signal is driven onto the transmitter electrode.

In one embodiment, the CBC circuit may include passive circuit components (e.g., a CBC capacitor) in order to correct the receiver voltage. Instead of using a CBC capacitor for each receiver, the input device may use a single CBC capacitor and a plurality of current mirrors to source and/or sink the current required to correct the input voltage of the receivers in the device. As a result the current-mode CBC circuit includes only one passive capacitor and a plurality of current mirrors that may include digital circuit components (e.g., transistors) that require much less space on the integrated circuit than passive components. Thus, a current-mode CBC circuit may require less space in an integrated circuit relative to other CBC circuits by reducing the number of passive capacitors as well as reducing the size of each passive capacitor used.

Thus, the embodiments and examples set forth herein were presented in order to best explain the embodiments in accordance with the present technology and its particular application and to thereby enable those skilled in the art to make and use the invention. However, those skilled in the art will recognize that the foregoing description and examples have been presented for the purposes of illustration and example only. The description as set forth is not intended to be exhaustive or to limit the invention to the precise form disclosed.

In view of the foregoing, the scope of the present disclosure is determined by the claims that follow.

We claim:

1. A system comprising:
 a sensor comprising a transmitter electrode and a receiver electrode; and
 a coarse-baseline-correction (CBC) circuit, the CBC circuit comprising:
  a capacitor coupled to the transmitter electrode, and
  a current mirror where an input of the current mirror is electrically coupled to the capacitor and an output of the current mirror is coupled to the receiver electrode.

2. The system of claim 1, wherein the current mirror is configured to mirror a current at the input based on a programmable scaling factor.

3. The system of claim 1, wherein the current mirror is part of a current conveyor in the CBC circuit.

4. The system of claim 1, wherein the CBC circuit includes a plurality of current mirrors each comprising a respective input coupled to the capacitor and a respective output coupled to a respective one of a plurality of receiver electrodes.

5. The system of claim 4, wherein each of the plurality of current mirrors are configured to output a current that compensates for a change of charge at the plurality of receiver electrodes resulting from a transmitter signal driven onto the transmitter electrode.

6. The system of claim 1, wherein the capacitor comprises a programmable bank of capacitors.

7. The system of claim 1, wherein the CBC further comprises a resistance in series with the capacitor, the resistance is configured to synchronize charge transfer through the sensor and charge transfer through the CBC circuit.

8. The system of claim 1 further comprising a plurality of receiver circuits, each of the plurality of receiver circuits comprises a first output and a second output, wherein the second outputs from the plurality of receiver circuits are summed and the first outputs and the second outputs of the plurality of receiver circuits have different scaling factors.

9. The system of claim 1, wherein the capacitor is different from the transmitter electrode, and wherein the CBC circuit is configured to compensate for a change in voltage at the receiver electrode resulting from driving a transmitter signal on the transmitter electrode.

10. A processing system comprising:
 a transmitter circuit configured to drive a modulated signal on a transmitter electrode;
 a receiver circuit configured to receive a resulting signal from a receiver electrode based on the modulated signal; and
 a coarse-baseline-correction (CBC) circuit, the coarse-baseline-correction circuit comprising:

a capacitor coupled to an output of the transmitter circuit, and a current mirror where an input of the current mirror is electrically coupled to the capacitor and an output of the current mirror is coupled to an input of the receiver circuit.

11. The processing system of claim 10, wherein the transmitter circuit, receiver circuit, and the CBC circuit are located on a same integrated circuit.

12. The processing system of claim 10, wherein the current mirror is configured to mirror a current at the input based on a programmable scaling factor.

13. The processing system of claim 10, wherein the current mirror is part of a current conveyor in the CBC circuit.

14. The processing system of claim 10, wherein the CBC circuit includes a plurality of current mirrors each comprising a respective input coupled to the capacitor and a respective output coupled to a respective one of a plurality of receiver circuits.

15. The processing system of claim 14, wherein each of the plurality of current mirrors are configured to output a current that compensates for a change of charge at the inputs of the plurality of receiver circuits resulting from the modulated signal driven by the transmitter circuit on the transmitter electrode.

16. The processing system of claim 10, wherein the capacitor comprises a programmable bank of capacitors.

17. The processing system of claim 10, wherein the CBC further comprises a resistance in series with the capacitor, the resistance is configured to synchronize charge transfer through the transmitter and receiver electrodes and charge transfer through the CBC circuit.

18. The processing system of claim 10 further comprising a plurality of receiver circuits, each of the plurality of receiver circuits comprises a first output and a second output, wherein the second outputs from the receiver circuits are summed and the first outputs and the second outputs of the plrualtiy of receiver circuits have different scaling factors.

19. A coarse-baseline-correction (CBC) circuit, comprising:

a resistance element;

a capacitor coupled to the resistance element; and a plurality of current mirrors where each input of the plurality of current mirrors are electrically coupled to the capacitor and each output of the plurality of current mirrors are coupled to an input of respective receiver circuits, wherein the plurality of current mirrors generate respective currents that compensate for a change of charge at the input of the respective receiver circuits.

20. The CBC circuit of claim 19, wherein each of the plurality of current mirrors includes an adjustable scaling factor that varies the respective currents.

21. The CBC circuit of claim 19, wherein a current associated with the capacitor and the resistance element sets the respective currents generated by the plurality of current mirrors.

* * * * *